United States Patent
Sun et al.

(10) Patent No.: US 11,381,259 B2
(45) Date of Patent: *Jul. 5, 2022

(54) DECODING METHOD AND DEVICE FOR TURBO PRODUCT CODES, DECODER AND COMPUTER STORAGE MEDIUM

(71) Applicant: ZTE Corporation, Shenzhen (CN)

(72) Inventors: Erkun Sun, Shenzhen (CN); Weiming Wang, Shenzhen (CN); Junjie Yin, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/275,730

(22) PCT Filed: Sep. 12, 2019

(86) PCT No.: PCT/CN2019/105802
§ 371 (c)(1),
(2) Date: Mar. 12, 2021

(87) PCT Pub. No.: WO2020/052672
PCT Pub. Date: Mar. 19, 2020

(65) Prior Publication Data
US 2022/0038118 A1    Feb. 3, 2022

(30) Foreign Application Priority Data

Sep. 12, 2018  (CN) .......................... 201811063021.2

(51) Int. Cl.
*H03M 13/29*   (2006.01)
(52) U.S. Cl.
CPC ... *H03M 13/2975* (2013.01); *H03M 13/2909* (2013.01); *H03M 13/2948* (2013.01); *H03M 13/2963* (2013.01)

(58) Field of Classification Search
CPC ......... H03M 13/2975; H03M 13/2948; H03M 13/2963
See application file for complete search history.

(56) References Cited

U.S. PATENT DOCUMENTS

| 9,287,899 B1 * | 3/2016 | Mazahreh | ......... H03M 13/2921 |
| 10,153,786 B1 * | 12/2018 | Nguyen | ............ H03M 13/1102 |

(Continued)

FOREIGN PATENT DOCUMENTS

| CN | 1780152 A | 5/2006 |
| CN | 101557234 A | 10/2009 |

(Continued)

OTHER PUBLICATIONS

International Search Report PCT/CN2019/105802 filed Sep. 12, 2019; dated Dec. 19, 2019.

*Primary Examiner* — Joseph D Torres
(74) *Attorney, Agent, or Firm* — Cantor Colburn LLP

(57) ABSTRACT

A decoding method and device for Turbo product codes, a decoding device, a decoder and a computer storage medium are provided. The method includes: a received codeword of a Turbo product code is acquired, and iterative decoding is performed on the received codeword for a set first iterative decoding times (S101); a decoding result of iterative decoding performed for the first iteration times is judged according to a first decoding rule to obtain a decoding identifier representing the decoding result (S102); and error correction processing is performed on the Turbo product code on which iterative decoding is performed for the first iteration times according to the decoding identifier (S103).

18 Claims, 5 Drawing Sheets

(56) References Cited

U.S. PATENT DOCUMENTS

| | | | |
|---|---|---|---|
| 2002/0147954 A1* | 10/2002 | Shea | H03M 13/098 |
| | | | 714/755 |
| 2003/0110437 A1* | 6/2003 | Kim | H03M 13/4138 |
| | | | 714/752 |
| 2014/0129899 A1* | 5/2014 | Kumar | H03M 13/2966 |
| | | | 714/755 |

FOREIGN PATENT DOCUMENTS

| | | |
|---|---|---|
| CN | 101958720 A | 1/2011 |
| CN | 104980172 A | 10/2015 |
| WO | 2011082509 A1 | 7/2011 |

* cited by examiner

DECODING METHOD AND DEVICE FOR TURBO PRODUCT CODES, DECODER AND COMPUTER STORAGE MEDIUM

CROSS-REFERENCE TO RELATED DISCLOSURE

The present disclosure claims priority to Chinese Patent Application No. 201811063021.2, filed with the China National Intellectual Property Administration on Sep. 12, 2018 and entitled "Decoding method and device for Turbo product code, decoder and computer storage medium", the entire contents of which are incorporated herein by reference.

TECHNICAL FIELD

The disclosure relates to the field of error correction control, and particularly to a decoding method and device for Turbo product codes, a decoder and a computer storage medium.

BACKGROUND

Turbo product codes, as a soft input soft output-based iterative decoding algorithm, has become a research hotspot in the field of channel coding because the error correction performance thereof is quite close to the Shannon limit. In a related art, a software decoding algorithm is mainly adopted as a decoding method for a Turbo product code. However, under the condition of relatively few error codes, power consumption brought by the software decoding algorithm is high, and a hardware decoding algorithm is more suitable. However, in case of low bit error rate, there may be an error floor when the Turbo product code is decoded through the hardware decoding algorithm, and a main reason for occurrence of the error floor is formation of a deadlock or a deadlock-like structure. Since alternate row and column decoding is adopted when the Turbo product code is decoded through the hardware decoding algorithm, if an error occurring during row decoding and an error occurring during column decoding are consistent and both cannot be corrected, the deadlock or the deadlock-like structure is formed.

SUMMARY

For solving the existing technical problem, embodiments of the disclosure provide a decoding method and device for Turbo product codes, a decoder and a computer storage medium, which may effectively avoid occurrence of an error floor.

To this end, technical solutions of the embodiments of the disclosure are implemented as follows.

According to a first aspect, the embodiments of the disclosure provide a decoding method for Turbo product codes, which may include that: a received codeword of a Turbo product code is acquired, and iterative decoding is performed on the received codeword for a set first iteration times; a decoding result of iterative decoding performed for the first iteration times is judged according to a first decoding rule to obtain a decoding identifier representing the decoding result; and error correction processing is performed on the Turbo product code on which iterative decoding is performed for the first iteration times according to the decoding identifier.

According to a second aspect, the embodiments of the disclosure provide a decoding device for Turbo product codes, which may include: an acquisition module, configured to acquire a received codeword of a Turbo product code; a preliminary iterative decoding module, configured to perform iterative decoding on the received codeword for a set first iteration times and judge a decoding result of the iterative decoding performed for the first iteration times according to a first decoding rule to obtain a decoding identifier representing the decoding result; and a deadlock correction module, configured to perform error correction processing on the Turbo product code on which iterative decoding is performed for the first iteration times according to the decoding identifier.

According to a third aspect, the embodiments of the disclosure provide a decoder, which may include a processor and a memory configured to store a computer program capable of running in the processor, wherein the processor may be configured to run the computer program to execute the Decoding method for a Turbo product code as described in the first aspect.

According to a fourth aspect, the embodiments of the disclosure provide a computer storage medium, in which a computer program may be stored, wherein the computer program may be executed by a processor to implement the Decoding method for a Turbo product code as described in the first aspect.

According to a fifth aspect, the embodiments of the disclosure provide a computer program product, which may include a computer program stored in a non-transitory computer-readable storage medium, wherein the computer program may include a program instruction, and the program instruction may be executed by a computer to enable the computer to execute the method as described in each aspect.

DETAILED DESCRIPTION OF THE EMBODIMENTS

The technical solutions of the disclosure will further be elaborated below in combination with the drawings and specific embodiments in the specification. Unless otherwise defined, all the technical and scientific terms adopted herein have the same meanings usually understood by those skilled in the art of the disclosure. The terms adopted in the specification of the disclosure are only for describing the purposes of specific embodiments and not intended to limit the disclosure. Term "and/or" adopted herein includes any one and all combinations of one or more related items that are listed.

Figure 1:
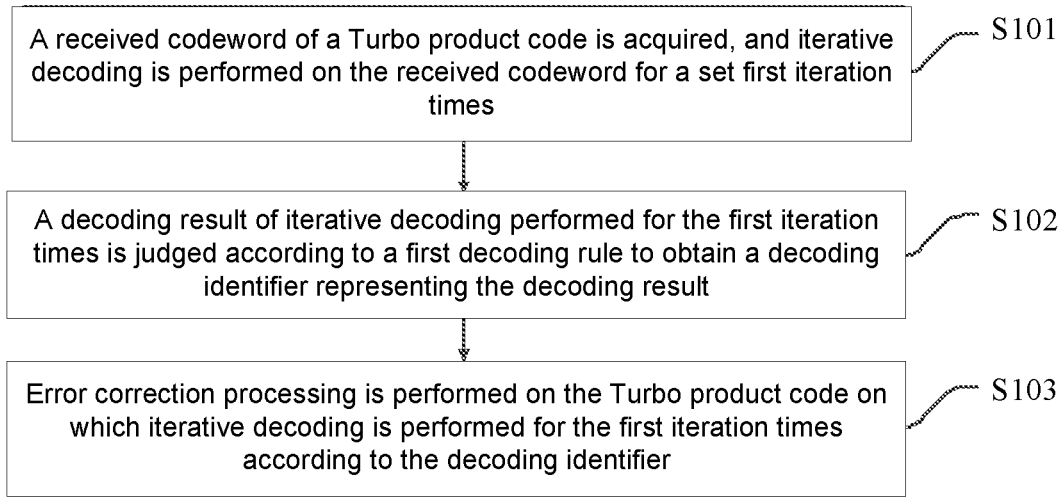
FIG. 1 is a flowchart of a decoding method for Turbo product codes according to an embodiment of the disclosure.

Referring to FIG. 1, a decoding method for Turbo product codes provided in an embodiment of the disclosure is shown, which includes the following steps.

In S101, a received codeword of a Turbo product code is acquired, and iterative decoding is performed on the received codeword for a set first iteration times.

In the embodiment, the decoding method for Turbo product codes is applied to, for example, a decoder. A coder constructs the Turbo product code according to a code pattern of a block code and then serially sends the Turbo product code bit by bit according to rows. The decoder converts a received serial bit sequence into an array the same as the Turbo product code in dimension, thereby obtaining the received codeword of the Turbo product code. The received codeword refers to all received codewords of the Turbo product code, and the received codewords include codewords existing in a row form and codewords existing in a column form. The first iteration times may be set as required by a practical condition, and for example, may be set to be three or four. It can be understood that the operation that iterative decoding is performed on the received codeword for the set first iteration times includes that: iterative decoding is performed on the received codeword for the set first iteration times according to a row and column iteration sequence. The row and column iteration sequence may be a sequence of performing row iteration and then column iteration and may also be a sequence of performing column iteration and then row iteration. A row iteration over the received codeword is recorded as an iteration, and similarly, a column iteration over the received codeword is also recorded as an iteration. In a process of performing iterative decoding on the received codeword for the set first iteration times, a row iteration times for the received codeword may be the same as or different from a column iteration times for the received codeword. In the embodiment, iterative decoding is performed for the first iteration times according to the sequence of performing row iteration and then column iteration on the received codeword.

In S102, a decoding result of iterative decoding performed for the first iteration times is judged according to a first decoding rule to obtain a decoding identifier representing the decoding result. Specifically, in each row iterative decoding and column iterative decoding process, a decoding result obtained by iterative decoding is judged according to the first decoding rule, thereby obtaining a decoding identifier representing the decoding result. The decoding result may be information such as the decoded received codeword and a corresponding error correction condition.

In an optional embodiment, before the operation that iterative decoding is performed on the received codeword for the set first iteration times, the method further includes that: a code pattern of a block code forming the Turbo product code is acquired, the code pattern including a maximum error-correctable code element number. The operation that the decoding result of iterative decoding performed for the first iteration times is judged according to the first decoding rule to obtain the decoding identifier representing the decoding result includes that: the decoding result of iterative decoding performed for the first iteration times is judged according to the first decoding rule, and the first decoding rule includes at least one of the following: determining that the received codeword fails to be decoded when it is determined according to the code pattern that the received codeword is a shortened code and not all code elements at supplementary positions in the decoded received codeword are 0; determining that the received codeword fails to be decoded when it is determined according to the code pattern that the received codeword is an extended code and an original check bit of the received codeword is different from a check bit of the decoded received codeword; and determining that the received codeword fails to be decoded when it is determined that an error-corrected code element number of the decoded received codeword is equal to the maximum error-correctable code element number of the received codeword, a present iterative decoding times is equal to a set iterative decoding times threshold and the number of codewords that fail to be decoded in a previous iterative decoding process is less than a set threshold, or when it is determined that the error-corrected code element number of the decoded received codeword is equal to the maximum error-correctable code element number of the received codeword and the present iterative decoding times is unequal to the iterative decoding times threshold. The decoding identifier of the decoding result corresponding to the received codeword is determined according to a judgment result.

In an embodiment, the decoder receives the code pattern of the block code forming the Turbo product code from the coder. For example, the Turbo product code is a two-dimensional Turbo product code. In such case, the code pattern of the block code includes (n1, k1, t1) and (n2, k2, t2), where n1 and n2 represent code lengths of corresponding block codes respectively, k1 and k2 represent information lengths of the corresponding block codes respectively, and t1 and t2 represent maximum error-correctable code element numbers of the corresponding block codes respectively. When a code length of the received codeword is less than the code length of the corresponding block code, it indicates that unnecessary code elements of first n columns or first n rows, i.e., code elements of which information bits are 0, in the Turbo product code are deleted before coding, namely the received codeword is a shortened code, n being an absolute value of a difference between the code length of the received codeword and the code length of the corresponding block code. For example, there is made such a hypothesis that the code pattern of the block code is (255, 239)×(255, 239), and if the code length of the received codeword is 248, it indicates that the received codeword is a shortened code and seven code elements of which information bits are 0 in the received codeword are deleted. Before the received codeword of the Turbo product code of which the code pattern is a shortened code is decoded, all the code elements at the supplementary positions in the received codeword may be filled with 0 at first, the supplementary position referring to a position of the deleted code element of which the information bit is 0. When the code length of the received codeword is greater than the code length of the corresponding block code, it indicates that the coder adds a check column obtained by executing an exclusive or operation on all rows in the Turbo product code and/or a check row obtained by executing an exclusive or operation on all columns in the Turbo product code to the Turbo product code, that is, the last code element of the received codeword is a check bit called the original check bit, namely the received codeword is an extended code.

The first decoding rule mainly includes judging the decoding result of iterative decoding performed for the first iteration times and obtaining the decoding identifier based on the three aspects of taking a shortened code as the code pattern, taking an extended code as the code pattern and the maximum error-correctable code element number. For example, if not all the code elements at the supplementary positions in the decoded received codeword are 0, it indicates that the code elements at the supplementary positions in the received codeword are decoded incorrectly and the received codeword fails to be decoded. For another example, when the received codeword of which the code pattern is an extended code is decoded, the original check bit in the received codeword is not decoded. After the received codeword is decoded, the exclusive or operation is executed on all the code elements in the decoded received codeword to obtain the check bit of the decoded received codeword. If the original check bit corresponding to the received codeword is different from the check bit of the Turbo product code, it indicates that there is an error in a process of decoding the received codeword, and it is determined that the received codeword fails to be decoded. For another example, when it is determined that the error-corrected code element number of the decoded received codeword is equal to the maximum error-correctable code element number of the received codeword, the present iterative decoding times is equal to the set iterative decoding times threshold and the number of the codewords that fail to be decoded in the previous iterative decoding process is less than the set threshold, it is determined that the received codeword fails to be decoded, thereby preventing more additional errors. When it is determined that the error-corrected code element number of the decoded received codeword is equal to the maximum error-correctable code element number of the received codeword, the present iterative decoding times is equal to the set iterative decoding times threshold and the number of the codewords that fail to be decoded in the previous iterative decoding process is equal to or greater than the set threshold, it is determined that the received codeword is decoded successfully, thereby improving the decoding flexibility. When it is determined that the error-corrected code element number of the decoded received codeword is equal to the maximum error-correctable code element number of the received codeword and the present iterative decoding times is unequal to the iterative decoding times threshold, it is determined that the received codeword fails to be decoded, thereby preventing more additional errors. In an embodiment, the maximum error-correctable code element number of the received codeword is a maximum error-correctable code element number of the block code that the received codeword belongs to. The previous iterative decoding process refers to a previous iterative decoding process of present iterative decoding determined according to the first iteration times. If present iterative decoding is row iterative decoding, previous iterative decoding is column iterative decoding. If present iterative decoding is column iterative decoding, previous iterative decoding is row iterative decoding. A coding unit may be a column and may also be a row. Correspondingly, if previous iterative decoding is row iterative decoding, the number of the codewords that fail to be decoded in the previous iterative decoding process is less than the set threshold and the number of rows that fail to be decoded in the previous iterative decoding process is less than a first set threshold; and if previous iterative decoding is column iterative decoding, the number of the codewords that fail to be decoded in the previous iterative decoding process is less than the set threshold and the number of columns that fail to be decoded in the previous iterative decoding process is less than a second set threshold. The first set threshold and the second set threshold may be set as required by the practical condition. For example, the first set threshold may be set to be 6, and the second set threshold may be set to be 7. The iterative decoding times threshold is less than the first iteration times and may be set as required by the practical condition. For example, the iterative decoding times threshold may be set to be three.

In an embodiment, the decoder, when determining the decoding identifier of the decoding result corresponding to the received codeword according to the judgment result, may record the decoding identifier of the decoding result corresponding to the received codeword according to a result obtained by judging the decoding result obtained by performing iterative decoding on the received codeword. The decoding identifier is configured to identify whether the received codeword is decoded successfully or not. For example, if it is determined according to the judgment result that the received codeword is decoded successfully, the decoding result corresponding to the received codeword may be identified with 1, and the number of codewords that are decoded successfully may be increased by 1. If it is determined according to the judgment result that the received codeword fails to be decoded, the decoding result corresponding to the received codeword may be identified with 0, and the number of codewords that fail to be decoded may be increased by 1. Of course, a row number or column number where the received codeword is located relative to the Turbo product code may also be recorded, and the corresponding row number or column number is bound with the decoding identifier.

In such a manner, the decoding result of iterative decoding performed on the received codeword for the first iteration times is judged through the first decoding rule and the decoding identifier of the decoding result corresponding to the received codeword is determined according to the judgment result, so that a reference is provided for subsequent error correction processing based on the decoding identifier to improve the error correction accuracy.

In an optional embodiment, before the operation that the decoding identifier of the decoding result corresponding to the received codeword is determined according to the judgment result, the method further includes that: a decoding identifier matrix is initialized, the decoding identifier matrix being equal to the Turbo product code in size; and the operation that the decoding identifier of the decoding result corresponding to the received codeword is determined according to the judgment result includes that: a decoding identifier of each code element in the received codeword at a corresponding position in the decoding identifier matrix is updated according to the judgment result.

In an embodiment, initializing the decoding identifier matrix may refer to setting a value corresponding to each element in the decoding identifier matrix to be 0. When it is determined according to the judgment result that a codeword is decoded successfully, the value of the codeword at the corresponding position in the decoding identifier matrix is set to be 1, namely a value of each code element in the codeword at a corresponding position in the decoding identifier matrix is set to be 1.

By setting the decoding identifier matrix equal to the Turbo product code in size, so as to allocate a position to each code element in the Turbo product code to record a corresponding decoding result. In such a manner, the decoding result of each code element in the iteration process may be obtained, so that whether there is a deadlock or a deadlock-like structure in the decoding process or not may be learned by analysis to provide a reference for subsequent error correction processing.

In an optional embodiment, the first decoding rule further includes: if error correction is performed on a code element in the received codeword and the decoding identifier corresponding to the code element in the decoding identifier matrix represents that the code element has been decoded successfully, determining that the code element fails to be decoded.

For example, if a received codeword formed by code elements of a first row in the Turbo product code is decoded and decoded successfully, a decoding identifier corresponding to the first code element in the decoding identifier matrix is set to be 1. If a received codeword formed by code elements of a first column in the Turbo product code is decoded and it is determined that error correction is performed on the first code element, it is determined that the first code element fails to be decoded, and the decoding identifier corresponding to the first code element in the decoding identifier matrix is updated to be 0.

In such a manner, a present decoding result of a code element is determined through a historical decoding result of the code element, so that the problem of repeated changing of a code element under the influence of another code element is solved, and the accuracy of the decoding result is improved.

In S103, error correction processing is performed on the Turbo product code on which iterative decoding is performed for the first iteration times according to the decoding identifier.

Specifically, error correction processing is performed on the Turbo product code on which iterative decoding is performed for the first iteration times according to the decoding identifier obtained by performing iterative decoding on the received codeword of the Turbo product code for the set first iteration times and representing the decoding result.

In an embodiment, since the decoding identifier may represent a decoding condition in the process of performing iterative decoding for the set first iteration times, whether a condition such as a deadlock or a deadlock-like structure occurs to the Turbo product code on which iterative decoding is performed for the first iteration times or not may be learned according to the decoding identifier. If there is a deadlock or deadlock-like structure in the Turbo product code on which iterative decoding is performed for the first iteration times, error correction processing is performed on the Turbo product code on which iterative decoding is performed for the first iteration times according to the decoding identifier to eliminate the deadlock or deadlock-like structure in the Turbo product code to avoid occurrence of an error floor.

To sum up, according to the decoding method for Turbo product codes provided in the embodiment, the decoding result of iterative decoding performed for the first iteration times is judged according to the first decoding rule to obtain the decoding identifier, and a code element recognized during iterative decoding performed for the first iteration times may be recorded through the decoding identifier, thereby performing error correction processing on the Turbo product code on which iterative decoding is performed according to the decoding identifier obtained by iterative decoding. The deadlock or deadlock-like structure in the Turbo product code may be eliminated, and occurrence of the error floor may be avoided effectively.

In an optional embodiment, the operation that error correction processing is performed on the Turbo product code on which iterative decoding is performed for the first iteration times according to the decoding identifier includes: the number of rows that fail to be decoded during last row iterative decoding corresponding to the first iteration times and the number of columns that fail to be decoded during last column iterative decoding are acquired according to the decoding identifier; and when it is determined that the number of the rows is equal to or greater than a set first number threshold and the number of the columns is equal to or greater than a set second number threshold, a negation operation is executed on a codeword that fails to be decoded in the Turbo product code on which iterative decoding is performed for the first iteration times.

For example, if the first iteration times is 6, first iterative decoding is row iterative decoding, second iterative decoding is column iterative decoding and so on, last row iterative decoding corresponding to the first iteration times is fifth iterative decoding, and last column iterative decoding corresponding to the first iteration times is sixth iterative decoding. Since decoding is performed iteratively and the Turbo product code may be updated every time when decoding succeeds to obtain a new decoded Turbo product code, last row iterative decoding and last column iterative decoding corresponding to the first iteration times are included in iterative decoding information before last row iterative decoding and last column iterative decoding. The first number threshold and the second number threshold may be determined according to the maximum error-correctable code element number of the corresponding block code. For example, when code patterns of block codes forming the Turbo product code are $(n_1, k_1, t_1)$ and $(n_2, k_2, t_2)$ and a size of the Turbo product code is $n_1 * n_2$, the first number threshold may be set to be $t_1+1$, and the second number threshold may be set to be $t_2+1$.

It can be understood that, when it is determined that the number of the rows is equal to or greater than the set first number threshold and the number of the columns is equal to or greater than the set second number threshold, it indicates that there may be a deadlock or deadlock-like structure in the Turbo product code on which iterative decoding is performed for the first iteration times. Executing the negation operation on the codeword that fails to be decoded in the Turbo product code on which iterative decoding is performed for the first iteration times may refer to executing the negation operation on all codewords that fail to be decoded in the Turbo product code on which iterative decoding is performed for the first iteration times and may also refer to executing the negation operation on part of the codewords that fail to be decoded in the Turbo product code on which iterative decoding is performed for the first iteration times, thereby eliminating the deadlock or the deadlock-like structure. For example, executing the negation operation on the codeword that fails to be decoded in the Turbo product code on which iterative decoding is performed for the first iteration times may refer to executing the negation operation on code elements that fail to be decoded in first $t_1+1$ rows and first $t_2+1$ columns in the Turbo product code on which iterative decoding is performed for the first iteration times, namely changing the code elements from 1 to 0 and from 0 to 1.

In such a manner, when it is determined that the number of the rows that fail to be decoded during last row iterative decoding corresponding to the first iteration times and the number of the columns that fail to be decoded during last column iterative decoding are greater than the corresponding number thresholds respectively, the negation operation is executed on the codeword that fails to be decoded in the Turbo product code on which iterative decoding is performed for the first iteration times, so that the deadlock or the deadlock-like structure is further eliminated accurately, and the decoding accuracy is improved.

In an optional embodiment, the operation that error correction processing is performed on the Turbo product code on which iterative decoding is performed for the first iteration times according to the decoding identifier includes that: the number of code elements that fail to be decoded is acquired according to the decoding identifier matrix; and the negation operation is executed on the code elements that fail to be decoded in the Turbo product code on which iterative decoding is performed for the first iteration times according to a relationship between the number of code elements that fail to be decoded and a set third number threshold.

In an embodiment, since the decoding result corresponding to each code element is recorded in the decoding identifier matrix, the number of the code elements that fail to be decoded may be acquired according to the decoding identifier matrix. The third number threshold may be set as required by the practical condition, and for example, may be set to be 10 or 16. Executing the negation operation on the code elements that fail to be decoded in the Turbo product code on which iterative decoding is performed for the first iteration times according to the relationship between the number of code elements that fail to be decoded and the set third number threshold may refer to executing the negation operation on part of the code elements that fail to be decoded in the Turbo product code on which iterative decoding is performed for the first iteration times when the number is greater than the set third number threshold and executing the negation operation on part of the code elements that fail to be decoded in the Turbo product code on which iterative decoding is performed for the first iteration times when the number is less than or equal to the set third number threshold. For example, when the number of 0, i.e., the number of the code elements that fail to be decoded, in the decoding identifier matrix is acquired and it is determined that the number of 0 in the decoding identifier matrix is greater than the set third number threshold, executing the negation operation on part of the code elements that fail to be decoded in the Turbo product code on which iterative decoding is performed for the first iteration times may refer to negating the first $(t_1+1)*(t_2+1)$ code elements that fail to be decoded in the Turbo product code on which iterative decoding is performed for the first iteration times. It can be understood that, when it is determined that the number of the code elements that fail to be decoded is greater than the set third number threshold, it indicates that there may be a deadlock or deadlock-like structure in the Turbo product code on which iterative decoding is performed for the first iteration times.

In such a manner, the number of the code elements that fail to be decoded is acquired according to the decoding identifier matrix, and the negation operation is executed on the code elements that fail to be decoded in the Turbo product code on which iterative decoding is performed for the first iteration times according to the relationship between the number of code elements that fail to be decoded and the set third number threshold, so that the deadlock or the deadlock-like structure is further eliminated accurately, and the decoding accuracy is improved.

In an optional embodiment, after the error correction processing is performed on the Turbo product code on which iterative decoding is performed for the first iteration times according to the decoding identifier, the method further includes that: iterative decoding is performed on the Turbo product code subjected to error correction processing for a set second iteration times; and a decoding result of iterative decoding performed for the second iteration times is judged according to a second decoding judgment rule to acquire a target Turbo product code.

It can be understood that the operation that iterative decoding is performed on the Turbo product code subjected to error correction processing for the set second iteration times includes that: iterative decoding is performed on the Turbo product code subjected to error correction processing for the set first iteration times according to the row and column iteration sequence. The row and column iteration sequence may be the sequence of performing row iteration and then column iteration and may also be the sequence of performing column iteration and then row iteration. When the first iteration times is an even number, if row iterative decoding is performed on the received codeword at first, row iterative decoding is also performed on the Turbo product code subjected to error correction processing at first, and if column iterative decoding is performed on the received codeword at first, column iterative decoding is also performed on the Turbo product code subjected to error correction processing at first. When the first iteration times is an odd number, if row iterative decoding is performed on the received codeword at first, column iterative decoding is performed on the Turbo product code subjected to error correction processing at first, and if column iterative decoding is performed on the received codeword at first, row iterative decoding is performed on the Turbo product code subjected to error correction processing at first. In an embodiment, the second iteration times may be set as required by the practical condition, and for example, may be set to be three or four. Under a normal condition, the second iteration times may be set to be less than the first iteration times. The second decoding judgment rule may be set as required by the practical condition. For example, the second decoding judgment rule may be part of rules in the first decoding judgment rule.

In such a manner, iterative decoding is performed on the Turbo product code subjected to error correction processing for the set second iteration times to implement error correction on an error code element that still exists in the Turbo product code subjected to error correction processing, so that the decoding accuracy is improved.

In an optional embodiment, the operation that the decoding result of iterative decoding performed for the second iteration times is judged according to the second decoding judgment rule includes that: the decoding result of iterative decoding performed for the second iteration times is judged according to the second decoding judgment rule, the second decoding rule including at least one of determining that the received codeword fails to be decoded when it is determined according to the code pattern that the received codeword is a shortened code and not all the code elements at the supplementary positions in the decoded received codeword are 0, determining that the received codeword fails to be decoded when it is determined according to the code pattern that the received codeword is an extended code and the original check bit of the received codeword is different from the check bit of the decoded received codeword and determining that the received codeword is decoded successfully when it is determined that the error-corrected code element number of the decoded received codeword is equal to the maximum error-correctable code element number of the received codeword.

In an embodiment, the received codeword refers to all the codewords of the Turbo product code subjected to error correction processing.

In such a manner, the decoding result of iterative decoding performed on the received codeword for the second iteration times is judged through the second decoding rule to improve the decoding accuracy.

Figure 2:
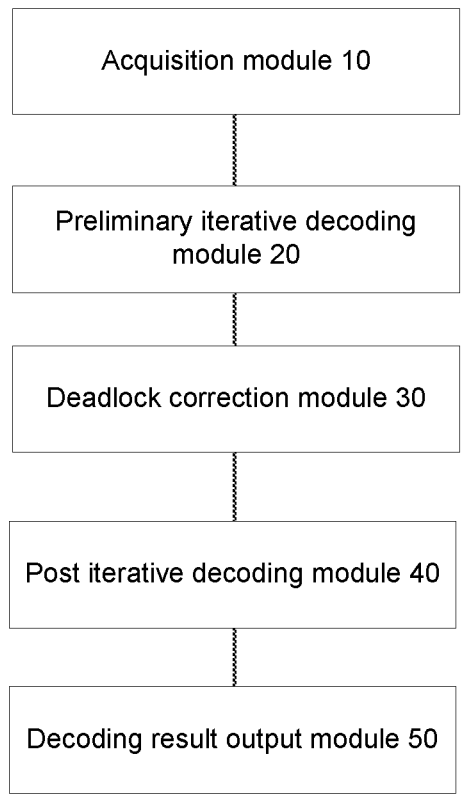
FIG. 2 is a structure diagram of a decoding device for Turbo product codes according to an embodiment of the disclosure.

For implementing the method, an embodiment of the disclosure also correspondingly provides a decoding device for Turbo product code. As shown in FIG. 2, the Decoding device for Turbo product code includes: an acquisition module 10, configured to acquire a received codeword of a Turbo product code; a preliminary iterative decoding module 20, configured to perform iterative decoding on the received codeword for a set first iteration times and judge a decoding result of the iterative decoding performed for the first iteration times according to a first decoding rule to obtain a decoding identifier representing the decoding result; and a deadlock correction module 30, configured to perform error correction processing on the Turbo product code on which iterative decoding is performed for the first iteration times according to the decoding identifier.

To sum up, in the decoding device for Turbo product code provided in the embodiment, the decoding result of iterative decoding performed for the first iteration times is judged according to the first decoding rule to obtain the decoding identifier, and a code element recognized during iterative decoding performed for the first iteration times may be recorded through the decoding identifier, thereby performing error correction processing on the Turbo product code on which iterative decoding is performed according to the decoding identifier obtained by iterative decoding. A deadlock or deadlock-like structure in the Turbo product code may be eliminated, and occurrence of an error floor may be avoided effectively.

In an optional embodiment, the acquisition module 10 is further configured to acquire a code pattern of a block code forming the Turbo product code, the code pattern including a maximum error-correctable code element number. The preliminary iterative decoding module 20 is specifically configured to judge the decoding result of iterative decoding performed for the first iteration times according to the first decoding rule, the first decoding rule including at least one of determining that the received codeword fails to be decoded when it is determined according to the code pattern that the received codeword is a shortened code and not all code elements at supplementary positions in the decoded received codeword are 0, determining that the received codeword fails to be decoded when it is determined according to the code pattern that the received codeword is an extended code and an original check bit of the received codeword is different from a check bit of the decoded received codeword and determining that the received codeword fails to be decoded when it is determined that an error-corrected code element number of the decoded received codeword is equal to the maximum error-correctable code element number of the received codeword, a present iterative decoding times is equal to a set iterative decoding times threshold and the number of codewords that fail to be decoded in a previous iterative decoding process is less than a set threshold or determining that the error-corrected code element number of the decoded received codeword is equal to the maximum error-correctable code element number of the received codeword and the present iterative decoding times is unequal to the iterative decoding times threshold, and determine the decoding identifier of the decoding result corresponding to the received codeword according to a judgment result.

In such a manner, the decoding result of iterative decoding performed on the received codeword for the first iteration times is judged through the set first decoding rule and the decoding identifier of the decoding result corresponding to the received codeword is determined according to the judgment result, so that a reference is provided for subsequent error correction processing based on the decoding identifier to improve the error correction accuracy.

In an optional embodiment, the preliminary iterative decoding module 20 is specifically configured to initialize a decoding identifier matrix, the decoding identifier matrix being equal to the Turbo product code in size, and update a decoding identifier of each code element in the received codeword at a corresponding position in the decoding identifier matrix according to the judgment result.

In such a manner, the decoding result of each code element in the iteration process may be obtained, so that whether there is a deadlock or a deadlock-like structure in the decoding process or not may be learned by analysis to provide a reference for subsequent error correction processing. In an optional embodiment, the first decoding rule also includes: if error correction is performed on a code element in the received codeword and a decoding identifier corresponding to the code element in the decoding identifier matrix represents that the code element has been decoded successfully, determining that the code element fails to be decoded.

In such a manner, a present decoding result of a code element is determined through a historical decoding result of the code element, so that the accuracy of the decoding result is improved.

In an optional embodiment, the deadlock correction module 30 is specifically configured to acquire the number of rows that fail to be decoded during last row iterative decoding corresponding to the first iteration times and the number of columns that fail to be decoded during last column iterative decoding according to the decoding identifier and, when it is determined that the number of the rows is equal to or greater than a set first number threshold and the number of the columns is equal to or greater than a set second number threshold, execute a negation operation on a codeword that fails to be decoded in the Turbo product code on which iterative decoding is performed for the first iteration times.

In such a manner, when it is determined that the number of the rows and the number of columns that fail to be decoded during last iterative decoding corresponding to the first iteration times are greater than the corresponding number thresholds respectively, the negation operation is executed on the codeword that fails to be decoded in the Turbo product code on which iterative decoding is performed for the first iteration times, so that the deadlock or the deadlock-like structure is further eliminated accurately, and the decoding accuracy is improved.

In an optional embodiment, the deadlock correction module 30 is specifically configured to acquire the number of code elements that fail to be decoded according to the decoding identifier matrix and execute the negation operation on the code elements that fail to be decoded in the Turbo product code on which iterative decoding is performed for the first iteration times according to a relationship between the number of code elements that fail to be decoded and a set third number threshold.

In such a manner, the number of the code elements that fail to be decoded is acquired according to the decoding identifier matrix, and the negation operation is executed on the code elements that fail to be decoded in the Turbo product code on which iterative decoding is performed for the first iteration times according to the relationship between the number of code elements that fail to be decoded and the set third number threshold, so that the deadlock or the deadlock-like structure is further eliminated accurately, and the decoding accuracy is improved.

In an optional embodiment, the Decoding device for Turbo product code further includes a post iterative decoding module 40, configured to perform iterative decoding on the Turbo product code subjected to error correction processing for a set second iteration times and judge a decoding result of iterative decoding performed for the second iteration times according to a second decoding judgment rule to acquire a target Turbo product code.

In such a manner, iterative decoding is performed on the Turbo product code subjected to error correction processing for the set second iteration times to implement error correction on an error code element that still exists in the Turbo product code subjected to error correction processing, so that the decoding accuracy is improved.

In an optional embodiment, the post iterative decoding module 40 is specifically configured to judge the decoding result of iterative decoding performed for the second iteration times according to the second decoding judgment rule, the second decoding rule including at least one of determining that the received codeword fails to be decoded when it is determined according to the code pattern that the received codeword is a shortened code and not all the code elements at the supplementary positions in the decoded received codeword are 0, determining that the received codeword fails to be decoded when it is determined according to the code pattern that the received codeword is an extended code and the original check bit of the received codeword is different from the check bit of the decoded received codeword and determining that the received codeword is decoded successfully when it is determined that the error-corrected code element number of the decoded received codeword is equal to the maximum error-correctable code element number of the received codeword.

In such a manner, the decoding result of iterative decoding performed on the received codeword for the second iteration times is judged through the second decoding rule to improve the decoding accuracy.

In an optional embodiment, the decoder further includes a decoding result output module 50, configured to output the target Turbo product code.

It is to be noted that the decoding device for Turbo product code provided in the embodiment is described with division of each abovementioned program module as an example when the decoding method for a Turbo product code is implemented and abovementioned processing may be allocated to different program modules as required during a practical disclosure, namely an internal structure of the decoding device for Turbo product code is divided into different program modules to complete all or part of above-described processing. In addition, the decoding device for Turbo product code provided in the embodiment belongs to the same concept of the corresponding decoding method for a Turbo product code embodiment, details about a specific implementation process thereof refer to the method embodiment, and elaborations are omitted herein.

Figure 3:
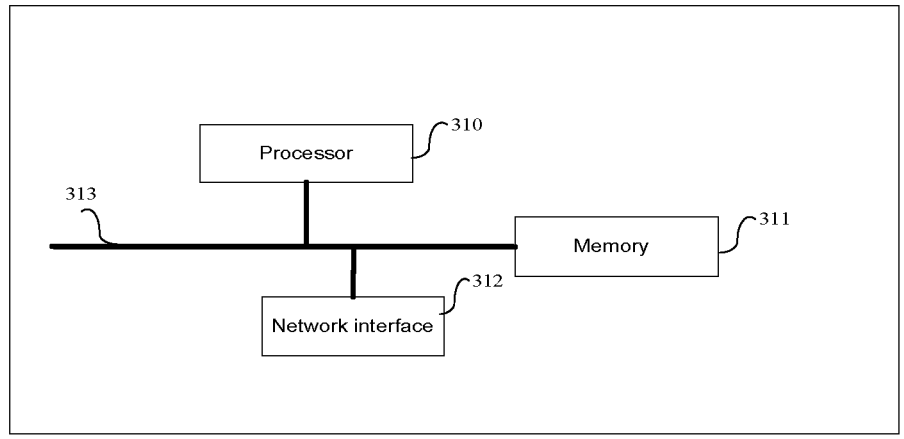
FIG. 3 is a structure diagram of a decoder according to an embodiment of the disclosure.

In another embodiment, the disclosure also provides a decoder. As shown in FIG. 3, the decoder includes a processor 310 and a memory 311 configured to store a computer program capable of running in the processor 310. The processor 310 shown in FIG. 3 is not intended to limit the number of the processor 310 to be 1 and only adopted to indicate a positional relationship between the processor 310 and another device, and during the practical disclosure, the number of the processor 310 may be one or multiple. Similarly, the memory 311 shown in FIG. 3 has the same meaning, namely only adopted to indicate a positional relationship between the memory 311 and another device, and during the practical disclosure, the number of the memory 311 may be one or multiple.

The processor 310 is configured to run the computer program to execute the following steps: a received codeword of a Turbo product code is acquired, and iterative decoding is performed on the received codeword for a set first iteration times; a decoding result of iterative decoding performed for the first iteration times is judged according to a first decoding rule to obtain a decoding identifier representing the decoding result; and error correction processing is performed on the Turbo product code on which iterative decoding is performed for the first iteration times according to the decoding identifier.

In an optional embodiment, the processor 310 is further configured to run the computer program to execute the following steps: a code pattern of a block code forming the Turbo product code is acquired, the code pattern including a maximum error-correctable code element number; the decoding result of iterative decoding performed for the first iteration times is judged according to the first decoding rule, the first decoding rule including at least one of determining that the received codeword fails to be decoded when it is determined according to the code pattern that the received codeword is a shortened code and not all code elements at supplementary positions in the decoded received codeword are 0, determining that the received codeword fails to be decoded when it is determined according to the code pattern that the received codeword is an extended code and an original check bit of the received codeword is different from a check bit of the decoded received codeword and determining that the received codeword fails to be decoded when it is determined that an error-corrected code element number of the decoded received codeword is equal to the maximum error-correctable code element number of the received codeword, a present iterative decoding times is equal to a set iterative decoding times threshold and the number of codewords that fail to be decoded in a previous iterative decoding process is less than a set threshold or determining that the error-corrected code element number of the decoded received codeword is equal to the maximum error-correctable code element number of the received codeword and the present iterative decoding times is unequal to the iterative decoding times threshold; and the decoding identifier of the decoding result corresponding to the received codeword is determined according to a judgment result.

In an optional embodiment, the processor 310 is further configured to run the computer program to execute the following steps: a decoding identifier matrix is initialized, the decoding identifier matrix being equal to the Turbo product code in size; and a decoding identifier of each code element in the received codeword at a corresponding position in the decoding identifier matrix is updated according to the judgment result.

In an optional embodiment, the processor 310 is further configured to run the computer program to execute the following steps: the number of rows that fail to be decoded during last row iterative decoding corresponding to the first iteration times and the number of columns that fail to be decoded during last column iterative decoding are acquired according to the decoding identifier; and when it is determined that the number of the rows is equal to or greater than a set first number threshold and the number of the columns is equal to or greater than a set second number threshold, a negation operation is executed on a codeword that fails to be decoded in the Turbo product code on which iterative decoding is performed for the first iteration times.

In an optional embodiment, the processor 310 is further configured to run the computer program to execute the following steps: the number of code elements that fail to be decoded is acquired according to the decoding identifier matrix; and the negation operation is executed on the code elements that fail to be decoded in the Turbo product code on which iterative decoding is performed for the first iteration times according to a relationship between the number of code elements that fail to be decoded and a set third number threshold.

In an optional embodiment, the processor 310 is further configured to run the computer program to execute the following steps: iterative decoding is performed on the Turbo product code subjected to error correction processing for a set second iteration times; and a decoding result of iterative decoding performed for the second iteration times is judged according to a set second decoding judgment rule to acquire a target Turbo product code.

In an optional embodiment, the processor 310 is further configured to run the computer program to execute the following step: the decoding result of iterative decoding performed for the second iteration times is judged according to the second decoding judgment rule, the second decoding rule including at least one of determining that the received codeword fails to be decoded when it is determined according to the code pattern that the received codeword is a shortened code and not all the code elements at the supplementary positions in the decoded received codeword are 0, determining that the received codeword fails to be decoded when it is determined according to the code pattern that the received codeword is an extended code and the original check bit of the received codeword is different from the check bit of the decoded received codeword and determining that the received codeword is decoded successfully when it is determined that the error-corrected code element number of the decoded received codeword is equal to the maximum error-correctable code element number of the received codeword.

The decoder further includes at least one network interface 312. Each component in the decoder is coupled together through a bus system 313. It can be understood that the bus system 313 is configured to implement connection communication between these components. The bus system 313 includes a data bus and also includes a power bus, a control bus and a state signal bus. However, for clear description, various buses in FIG. 3 are marked as the bus system 313.

The memory 311 may be a volatile memory or a non-volatile memory, and may also include both of the volatile and nonvolatile memories. The nonvolatile memory may be a Read Only Memory (ROM), a Programmable Read-Only Memory (PROM), an Erasable Programmable Read-Only Memory (EPROM), an Electrically Erasable Programmable Read-Only Memory (EEPROM), a Ferromagnetic Random Access Memory (FRAM), a flash memory, a magnetic surface memory, an optical disk or a Compact Disc Read-Only Memory (CD-ROM). The magnetic surface memory may be a disk memory or a tape memory. The volatile memory may be a Random Access Memory (RAM), and is used as an external high-speed cache. It is exemplarily but unlimitedly described that RAMs in various forms may be adopted, such as a Static Random Access Memory (SRAM), a Synchronous Static Random Access Memory (SSRAM), a Dynamic Random Access Memory (DRAM), a Synchronous Dynamic Random Access Memory (SDRAM), a Double Data Rate Synchronous Dynamic Random Access Memory (DDRSDRAM), an Enhanced Synchronous Dynamic Random Access Memory (ESDRAM), a SyncLink Dynamic Random Access Memory (SLDRAM) and a Direct Rambus Random Access Memory (DRRAM). The memory 311 described in the embodiment of the disclosure is intended to include, but not limited to, memories of these and any other proper types.

In the embodiment of the disclosure, the memory 311 is configured to store various types of data to support the operations of the decoder. Examples of such data include any disclosure program, such as an operating system and an disclosure program, operated in the decoder, contact data, phonebook data, messages, pictures, video, etc. The operating system includes various system programs, such as a framework layer, a core library layer and a driver layer, configured to implement various basic services and process hardware-based tasks. The disclosure program may include various disclosure programs, such as a media player and a browser, configured to implement various disclosure services. In an embodiment, the program for implementing the method of the embodiment of the disclosure may be included in the disclosure program.

The embodiment also provides a computer storage medium. A computer program is stored in the computer storage medium. The computer storage medium may be a memory such as an FRAM, a ROM, a PROM, an EPROM, an EEPROM, a flash memory, a magnetic surface memory, an optical disk or a CD-ROM, and may also be any device including one or any combination of the abovementioned memories, such as a mobile phone, a computer, a tablet device and a personal digital assistant.

According to a computer storage medium, a computer program is stored in the computer storage medium. The computer program is run by a processor to execute the following steps: a received codeword of a Turbo product code is acquired, and iterative decoding is performed on the received codeword for a set first iteration times; a decoding result of iterative decoding performed for the first iteration times is judged according to a first decoding rule to obtain a decoding identifier representing the decoding result; and error correction processing is performed on the Turbo product code on which iterative decoding is performed for the first iteration times according to the decoding identifier.

In an optional embodiment, the computer program is run by the processor to further execute the following steps: a code pattern of a block code forming the Turbo product code is acquired, the code pattern including a maximum error-correctable code element number; the decoding result of iterative decoding performed for the first iteration times is judged according to the first decoding rule, the first decoding rule including at least one of determining that the received codeword fails to be decoded when it is determined according to the code pattern that the received codeword is a shortened code and not all code elements at supplementary positions in the decoded received codeword are 0, determining that the received codeword fails to be decoded when it is determined according to the code pattern that the received codeword is an extended code and an original check bit of the received codeword is different from a check bit of the decoded received codeword and determining that the received codeword fails to be decoded when it is determined that an error-corrected code element number of the decoded received codeword is equal to the maximum error-correctable code element number of the received codeword, a present iterative decoding times is equal to a set iterative decoding times threshold and the number of codewords that fail to be decoded in a previous iterative decoding process is less than a set threshold or determining that the error-corrected code element number of the decoded received codeword is equal to the maximum error-correctable code element number of the received codeword and the present iterative decoding times is unequal to the iterative decoding times threshold; and the decoding identifier of the decoding result corresponding to the received codeword is determined according to a judgment result.

In an optional embodiment, the computer program is run by the processor to further execute the following steps: a decoding identifier matrix is initialized, the decoding identifier matrix being equal to the Turbo product code in size; and a decoding identifier of each code element in the received codeword at a corresponding position in the decoding identifier matrix is updated according to the judgment result.

In an optional embodiment, the computer program is run by the processor to further execute the following steps: the number of rows that fail to be decoded during last row iterative decoding corresponding to the first iteration times and the number of columns that fail to be decoded during last column iterative decoding are acquired according to the decoding identifier; and when it is determined that the number of the rows is equal to or greater than a set first number threshold and the number of the columns is equal to or greater than a set second number threshold, a negation operation is executed on a codeword that fails to be decoded in the Turbo product code on which iterative decoding is performed for the first iteration times.

In an optional embodiment, the computer program is run by the processor to further execute the following steps: the number of code elements that fail to be decoded is acquired according to the decoding identifier matrix; and the negation operation is executed on the code elements that fail to be decoded in the Turbo product code on which iterative decoding is performed for the first iteration times according to a relationship between the number of code elements that fail to be decoded and a set third number threshold.

In an optional embodiment, the computer program is run by the processor to further execute the following steps: iterative decoding is performed on the Turbo product code subjected to error correction processing for a set second iteration times; and a decoding result of iterative decoding performed for the second iteration times is judged according to a second decoding judgment rule to acquire a target Turbo product code.

In an optional embodiment, the computer program is run by the processor to further execute the following step: the decoding result of iterative decoding performed for the second iteration times is judged according to the second decoding judgment rule, the second decoding rule including at least one of determining that the received codeword fails to be decoded when it is determined according to the code pattern that the received codeword is a shortened code and not all the code elements at the supplementary positions in the decoded received codeword are 0, determining that the received codeword fails to be decoded when it is determined according to the code pattern that the received codeword is an extended code and the original check bit of the received codeword is different from the check bit of the decoded received codeword and determining that the received codeword is decoded successfully when it is determined that the error-corrected code element number of the decoded received codeword is equal to the maximum error-correctable code element number of the received codeword.

Figure 4:
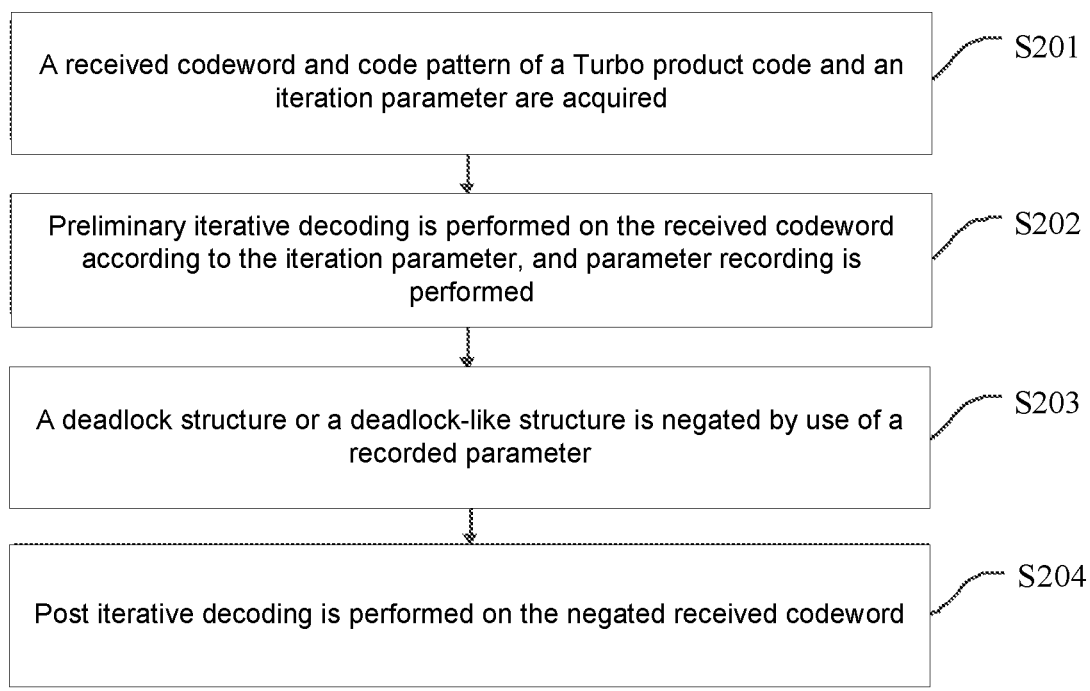
FIG. 4 is a flowchart of a decoding method for Turbo product codes according to an embodiment of the disclosure.

The embodiments of the disclosure will further be described below through a specific example in detail. Referring to FIG. 4, a decoding method for Turbo product codes provided in an optional specific embodiment of the disclosure is shown, which includes the following steps. In S201, a received codeword and code pattern of a Turbo product code and an iteration parameter are acquired. In an embodiment, the Turbo product code is a product code which is constructed by arranging codewords of two or more groups of block codes in a two-dimensional or multidimensional matrix and of which sub-codes have a minimum distance characteristic. The code pattern of the Turbo product code includes (128, 120)×(128, 120), (128, 127)×(128, 127), (64, 57)×(64, 57), (32, 26)×(16, 15)×(8, 7), etc. When a sender sends information, the Turbo product code is serially sent bit by bit according to rows. A receiver converts a received serial sequence into a two-dimensional matrix form and then performs decoding according to a matrix structure. The decoding complexity and decoding delay of the Turbo product code depend on code patterns of the sub-codes and are linearly increased along with the increase of the construction complexity and decoding complexity of the sub-codes. Since the code pattern of the received codeword may not be judged according to the received codeword, it is necessary to simultaneously acquire the received codeword r_in and the code pattern and set a preliminary iterative decoding times and a post iterative decoding times for subsequent decoding. In the embodiment, code patterns ($n_1$, $k_1$, $t_1$) and ($n_2$, $k_2$, $t_2$) are adopted for row and column iterative decoding of the Turbo product code, where $n_i$ is a code length, $k_i$ is an information length, and $t_i$ is an error correction capability, i belonging to a set $\{1, 2\}$. The iteration parameter includes the preliminary iterative decoding times m1 and the post iterative decoding times m2.

In S202, preliminary iterative decoding is performed on the received codeword according to the iteration parameter, and parameter recording is performed. If there is a decoding identifier matrix, the decoding identifier matrix is initialized at first, namely a decoding identifier is stored for each data bit according to a code block size of the Turbo product code, a size of the decoding identifier matrix being the size of the Turbo product code, and all initial values are set to be 0.

When preliminary iterative decoding is performed on the received codeword r_in for the iterative decoding times m1 and preliminary iterative decoding is alternate decoding of row iterative decoding and column iterative decoding, the following judgment conditions are included.

1) If the code pattern of the codeword is a shortened code, it is judged whether all supplementary positions of the decoded codeword are 0 or not, and if NO, it indicates that decoding fails.

2) If the code pattern of the codeword is an extended code, it is judged whether a check bit obtained by performing exclusive or calculation on the decoded codeword is the same as an original check bit of the codeword before decoding, and if NO, it indicates that decoding fails.

3) If there is the decoding identifier matrix and a decoding identifier of an error-corrected code element in the decoding identifier matrix is 1 when a certain codeword is decoded, it is determined that decoding fails.

4) If an error-corrected code element number is an error correction capability limit for decoding of a certain codeword when the codeword is decoded, it is determined that decoding fails. However, if a present iterative decoding times is equal to a set iterative decoding times threshold and a relatively large number of rows or columns are decoded incorrectly in a previous iterative decoding process of present iterative decoding, it is determined that decoding succeeds under the decoding condition that the error-corrected code element number is the error correction capability limit for decoding of the codeword during present iterative decoding.

Therefore, the number of error code elements may be reduced by preliminary iterative decoding.

In S203, a deadlock structure or a deadlock-like structure is negated by use of a recorded parameter. If there is the decoding identifier matrix, the number of 0 in the decoding identifier matrix is judged, and if the number of 0 in the decoding identifier matrix is greater than a set threshold num1, a negation operation is executed on first $(t_1+1)*(t_2+1)$ code elements that are decoded incorrectly. If the number of 0 in the decoding identifier matrix is less than the threshold num1, all data corresponding to positions of 0, i.e., code elements that are decoded incorrectly, in the decoding identifier matrix are negated.

If there is no decoding identifier matrix, rows and columns corresponding to decoding errors are recorded during last row iterative decoding and last column iterative decoding of preliminary iterative decoding respectively, and if the number of the rows that are decoded incorrectly is equal to or greater than $t_1+1$ and the number of the columns that are decoded incorrectly is equal to or greater than $t_2+1$, the data of the first $t_1+1$ rows and the $t_2+1$ columns in the codeword that is decoded incorrectly is negated, or part of the data is selected for negation, thereby eliminating the deadlock structure.

In S204, post iterative decoding is performed on the negated received codeword. When post iterative decoding is performed on the negated received codeword for the post iteration times m2, the following judgment conditions are included.

5) If the code pattern of the codeword is a shortened code, it is judged whether all the supplementary positions of the decoded codeword are 0 or not, and if NO, it indicates that decoding fails.

6) If the code pattern of the codeword is an extended code, it is judged whether the check bit obtained by performing exclusive or calculation on the decoded codeword is the same as the original check bit of the codeword before decoding, and if NO, it indicates that decoding fails.

7) If an error-corrected code element number is an error correction capability limit for decoding of a certain codeword when the codeword is decoded, it is determined that decoding succeeds. Finally, updated r_in is output after post iterative decoding is completed.

In such a manner, error correction is performed on an error code element that may exist after preliminary iterative decoding by post iterative decoding, thereby eliminating a part that is not completely decoded.

Figure 5:
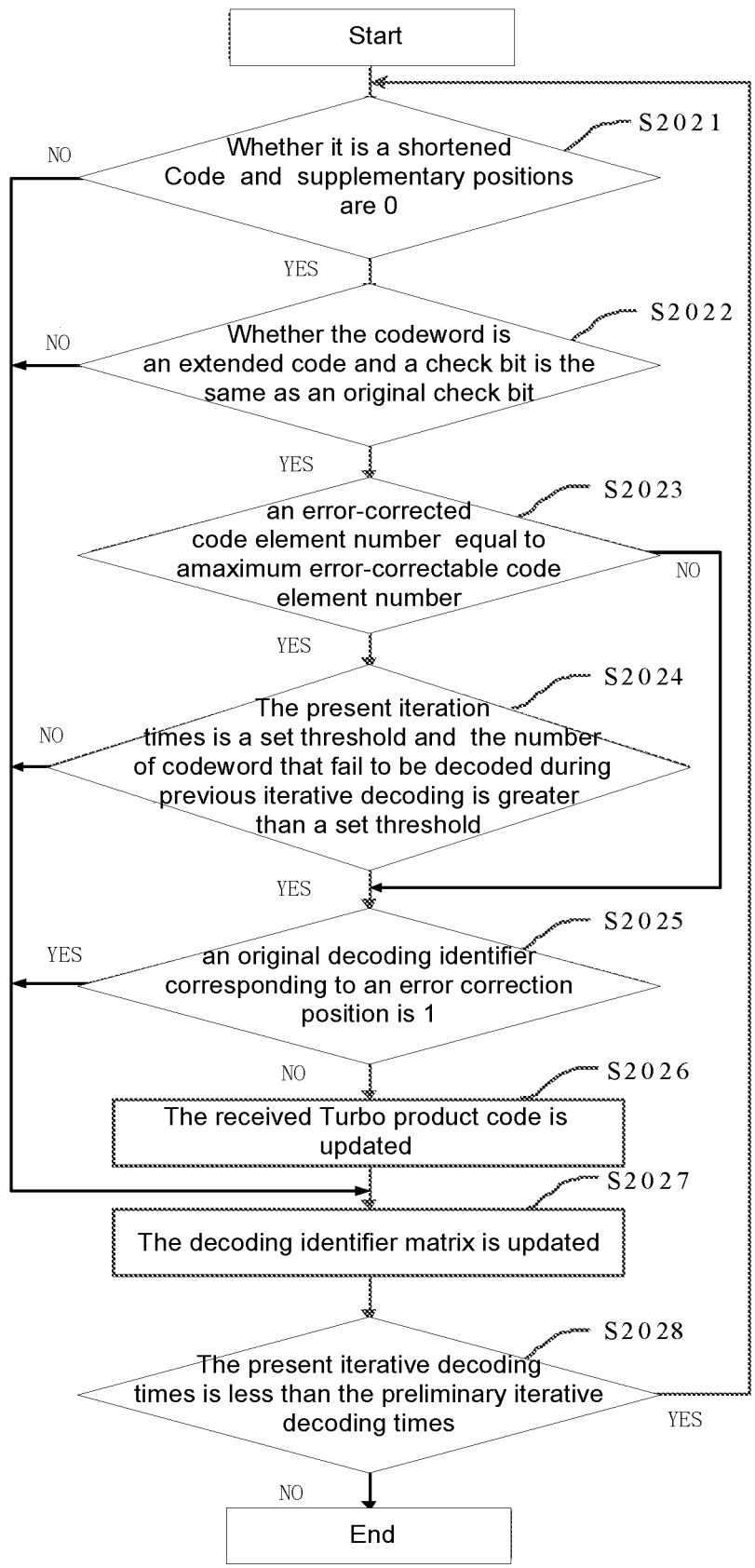
FIG. 5 is a flowchart of performing preliminary iterative decoding on a received codeword according to an iteration parameter and performing parameter recording according to an embodiment of the disclosure.

In an exemplary embodiment, referring to FIG. 5, an application scenario that the embodiment is based on is that there is the decoding identifier matrix. The operation that preliminary iterative decoding is performed on the received codeword according to the iteration parameter and parameter recording is performed includes the following S2021 to S2028. In S2021, a received codeword is acquired, it is judged whether it is a shortened code or not and whether supplementary positions are 0 or not, if YES, S2022 is executed, otherwise S2027 is executed. In an embodiment, the received codeword is sequentially acquired from the Turbo product code according to a sequence of preliminary iterative decoding, it is judged whether the code pattern of the codeword is a shortened code or not, if the code pattern of the codeword is a shortened code, it is judged whether all the supplementary positions of the codeword are 0 or not, and if NO, it indicates decoding fails.

In S2022, it is judged whether the codeword is an extended code or not and whether a check bit is the same as an original check bit or not, if YES, S2023 is executed, otherwise S2027 is executed. In an embodiment, it is judged whether the code pattern of the codeword is an extended code or not, if the code pattern of the codeword is an extended code, it is judged whether the check bit obtained by performing exclusive or calculation on the decoded codeword is the same as the original check bit of the codeword before decoding or not, and if NO, it indicates that decoding fails.

In S2023, it is judged whether an error-corrected code element number is equal to a maximum error-correctable code element number or not, if YES, S2024 is executed, otherwise S2025 is executed. Specifically, it is judged whether the error-corrected code element number after the codeword is decoded is equal to the maximum error-correctable code element number of the codeword or not, if YES, S2024 is executed, otherwise S2025 is executed.

In S2024, it is judged whether a present iteration times is a set threshold or not and whether the number of codewords that fail to be decoded during previous iterative decoding is greater than a set threshold or not, if YES, S2025 is executed, otherwise S2027 is executed. In an embodiment, the threshold may be set as required by a practical condition, and a corresponding iteration times may be recorded every time when iterative decoding is started. The threshold may be set as required by the practical condition, for example, set to be 5 or 6.

In S2025, it is judged whether the error-corrected code element number is equal to the maximum error-correctable code element number or not, if YES, S2025 is executed, otherwise S2027 is executed. Specifically, it is judged whether the error-corrected code element number after the codeword is decoded is equal to the maximum error-correctable code element number of the codeword or not, if YES, S2025 is executed, otherwise S2027 is executed.

In S2025, it is judged whether an original decoding identifier corresponding to an error correction position is 1 or not, if NO, S2026 is executed, otherwise S2027 is executed. In an embodiment, after the codeword is decoded, if the decoding identifier corresponding to a code element on which error correction is presently performed, i.e., the error correction position, in the decoding identifier matrix is 1, it is determined that the codeword fails to be decoded.

In S2026, the received Turbo product code is updated. Specifically, a decoding result corresponding to a row or column that is decoded correctly is updated to a corresponding value of r_in, thereby completing updating the received Turbo product code. A row K_id1 that is decoded correctly is recorded during last row iterative decoding of preliminary iterative decoding, and a column K_id2 that is decoded correctly is recorded during last column iterative decoding.

In S2027, the decoding identifier matrix is updated. Specifically, the decoding identifier matrix is updated according to the decoding result. If the codeword is decoded successfully, all rows or columns where the codeword is located in the decoding identifier matrix are set to be 1. If the codeword fails to be decoded, all the rows or columns where the codeword is located in the decoding identifier matrix are set to be 0.

In S2028, it is judged whether the present iterative decoding times is less than the preliminary iterative decoding times or not, if YES, S2021 is re-executed, otherwise the flow is ended.

It is to be noted that, when there is the decoding identifier matrix, the dead-lock structure may be negated according to the following conditions.

1) If K_id1 is a full row number or K_id2 is a full column number, r_in is updated according to the decoding result, and post iterative decoding is executed.

2) The number of 0 in the decoding identifier matrix is judged, if the number is greater than the set threshold num1, bit-based negation is performed on r_in at positions corresponding to the first $(t_1+1)*(t_2+1)$ 0 in the decoding identifier matrix, otherwise r_in at positions corresponding to all 0 is negated.

In the embodiment, the decoding identifier matrix is added to judge whether decoding succeeds or not, so that the problem that a codeword is originally decoded correctly but repeatedly changes under the influence of another codeword is solved.

Figure 6:
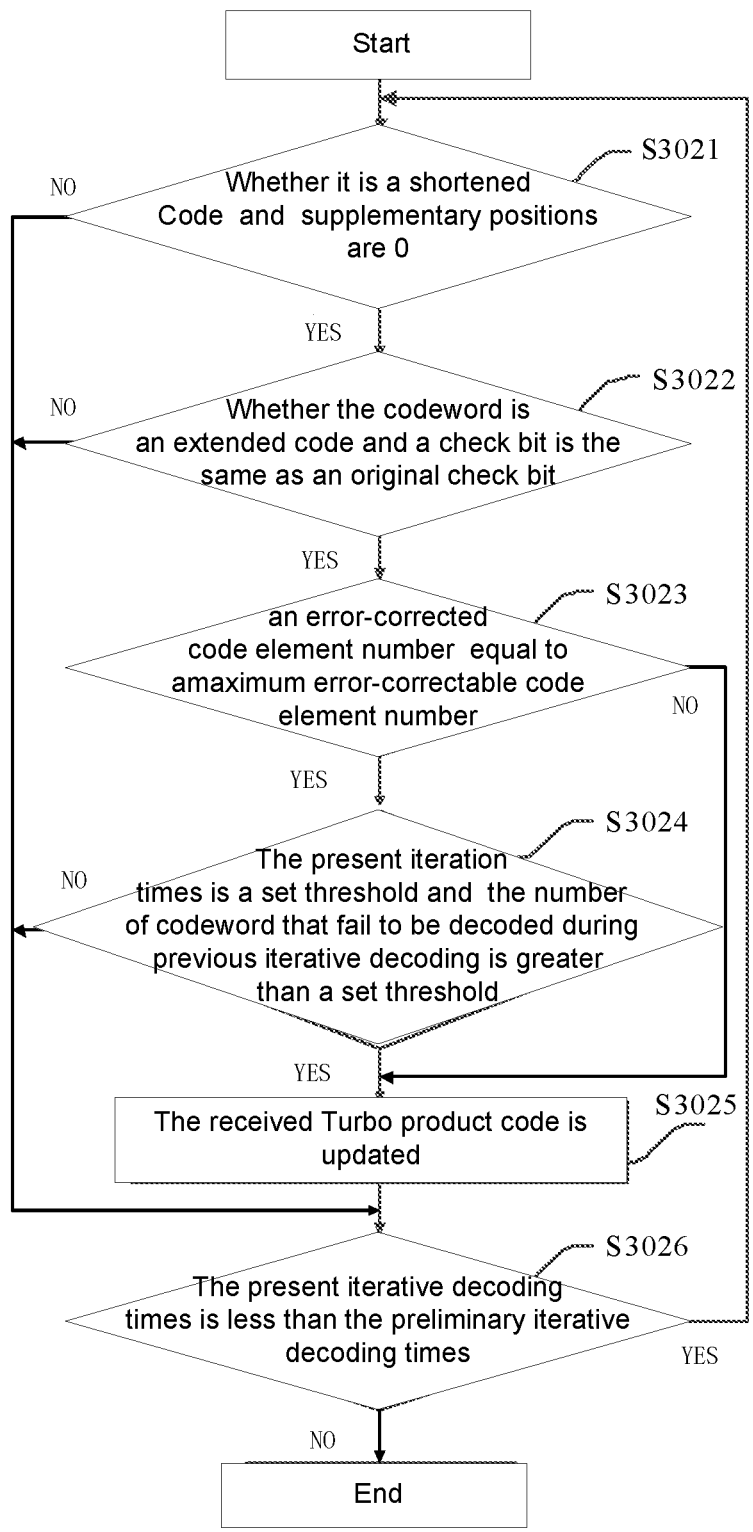
FIG. 6 is a flowchart of performing preliminary iterative decoding on a received codeword according to an iteration parameter and performing parameter recording according to another embodiment of the disclosure.

In an exemplary embodiment, referring to FIG. 6, an disclosure scenario that the embodiment is based on is that there is no decoding identifier matrix. The operation that preliminary iterative decoding is performed on the received codeword according to the iteration parameter and parameter recording is performed includes the following S3021 to S3026. In S3021, a received codeword is acquired, it is judged whether it is a shortened code or not and whether supplementary positions are 0 or not, if YES, S3022 is executed, otherwise S3026 is executed. In an embodiment, the received codeword is sequentially acquired from the Turbo product code according to a sequence of preliminary iterative decoding, it is judged whether the code pattern of the codeword is a shortened code or not, if the code pattern of the codeword is a shortened code, it is judged whether all the supplementary positions of the codeword are 0 or not, and if NO, it indicates decoding fails.

In S3022, it is judged whether the codeword is an extended code or not and whether a check bit is the same as an original check bit or not, if YES, S3023 is executed, otherwise S3026 is executed. In an embodiment, it is judged whether the code pattern of the codeword is an extended code or not, if the code pattern of the codeword is an extended code, it is judged whether the check bit obtained by performing exclusive or calculation on the decoded codeword is the same as the original check bit of the codeword before decoding or not, and if NO, it indicates that decoding fails.

In S3023, it is judged whether an error-corrected code element number is equal to a maximum error-correctable code element number or not, if YES, S3024 is executed, otherwise S3025 is executed. Specifically, it is judged whether the error-corrected code element number after the codeword is decoded is equal to the maximum error-correctable code element number of the codeword or not, if YES, S3024 is executed, otherwise S3025 is executed.

In S3024, it is judged whether a present iteration times is a set threshold or not and whether the number of codewords that fail to be decoded during previous iterative decoding is greater than a set threshold or not, if YES, S3025 is executed, otherwise S3026 is executed. In an embodiment, the threshold may be set as required by a practical condition, and a corresponding iteration times may be recorded every time when iterative decoding is started. The threshold may be set as required by the practical condition, for example, set to be 5 or 6.

In S3025, the received Turbo product code is updated. Specifically, a decoding result corresponding to a row or column that is decoded correctly is updated to a corresponding value of r_in, thereby completing updating the received Turbo product code. A row K_id1 that is decoded correctly is recorded during last row iterative decoding of preliminary iterative decoding, and a column K_id2 that is decoded correctly is recorded during last column iterative decoding.

In S3026, it is judged whether the present iterative decoding times is less than the preliminary iterative decoding times or not, if YES, S3021 is re-executed, otherwise the flow is ended.

In the embodiment, the decoding identifier matrix is omitted, and the condition of the error correction limit is kept unchanged before the deadlock structure or the deadlock-like structure is corrected, to prevent more additional errors. If there are more errors, the condition of the error correction limit is considered as successful decoding, so that the decoding flexibility is improved.

Figure 7:
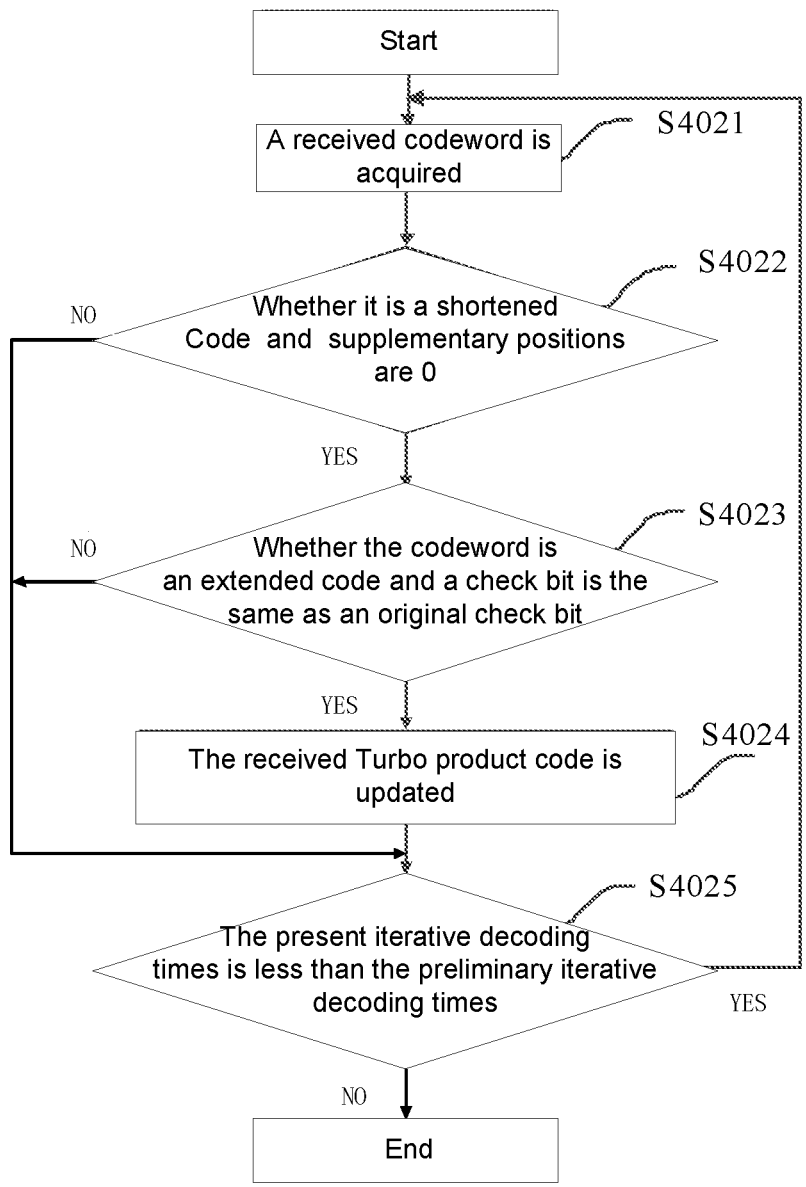
FIG. 7 is a flowchart of performing post iterative decoding on a negated received codeword according to an embodiment of the disclosure.

In an exemplary embodiment, referring to FIG. 7, the operation that post iterative decoding is performed on the negated received codeword includes the following S4021 to S4025. In S4021, a received codeword is acquired. In an embodiment, the received codeword is sequentially acquired from the updated Turbo product code according to a sequence of post iterative decoding.

In S4022, it is judged whether the codeword is a shortened code or not and whether supplementary positions are 0 or not, if YES, S4022 is executed, otherwise S4025 is executed. In an embodiment, it is judged whether a code pattern of the codeword is a shortened code or not, if the code pattern of the codeword is a shortened code, it is judged whether all the supplementary positions of the codeword are 0 or not, and if NO, it indicates that decoding fails.

In S4023, it is judged whether the codeword is an extended code or not and whether a check bit is the same as an original check bit or not, if YES, S4024 is executed, otherwise S4025 is executed. In an embodiment, it is judged whether the code pattern of the codeword is an extended code or not, if the code pattern of the codeword is an extended code, it is judged whether the check bit obtained by performing exclusive or calculation on the decoded codeword is the same as the original check bit of the codeword before decoding or not, and if NO, it indicates that decoding fails.

In S4024, the received Turbo product code is updated. In an embodiment, after it is determined that the codeword is decoded successfully, the received Turbo product code is updated according to the decoding result.

In S4025, it is judged whether the present iterative decoding times is less than the post iterative decoding times or not, if YES, S4021 is re-executed, otherwise the flow is ended.

In an embodiment, the present iterative decoding times may be updated every time when iterative decoding is started.

For implementing the method, referring to FIG. 2 again, a Decoding device for Turbo product code provided in an optional specific embodiment of the disclosure is shown, which includes: an acquisition module 10, configured to acquire a received code and code pattern of a Turbo product code and an iteration parameter; a preliminary iterative decoding module 20, configured to construct a decoding identifier matrix, perform hard judgment on the received codeword to acquire a decoded codeword, judge whether decoding succeeds or not according to the code pattern and a judgment condition and update the decoding identifier matrix; a deadlock correction module 30, configured to negate a probable error bit according to the decoding identifier matrix; a post iterative decoding module 40, configured to perform post iterative decoding on the received codeword and judge whether decoding succeeds or not according to a given judgment condition; and a decoding result output module 50, configured to output a decoding result of the received codeword.

In an embodiment, the code pattern includes a code length, an information length and an error correction capability. The deadlock correction module 30, when negating the probable error bit according to the decoding identifier matrix, may compare the number of error positions in a code block and a threshold, and if the number is greater than the threshold, determine that the number of negated error positions may be (t1+1)*(t2+1), t1 and t2 being error correction capabilities respectively. Error bits left after deadlock structure correction are eliminated through a post iterative decoding process of the post iterative decoding module 40.

The above is only the specific implementation mode of the disclosure and not intended to limit the scope of protection of the disclosure. Any variations or replacements apparent to those skilled in the art within the technical scope disclosed by the disclosure shall fall within the scope of protection of the disclosure. The scope of protection of the disclosure shall be subject to the scope of protection of the claims.

What is claimed is:

1. A decoding method for a Turbo product code, comprising:
   acquiring a received codeword of a Turbo product code, and performing iterative decoding on the received codeword for a set first iteration times;
   judging a decoding result of iterative decoding performed for the first iteration times according to a first decoding rule to obtain a decoding identifier representing the decoding result; and
   performing error correction processing on the Turbo product code on which iterative decoding is performed for the first iteration times according to the decoding identifier;
   wherein performing error correction processing on the Turbo product code on which iterative decoding is performed for the first iteration times according to the decoding identifier comprises:
   acquiring the number of rows that fail to be decoded during last row iterative decoding corresponding to the first iteration times and the number of columns that fail to be decoded during last column iterative decoding according to the decoding identifier; and
   when it is determined that the number of the rows is equal to or greater than a set first number threshold and the number of the columns is equal to or greater than a set second number threshold, executing a negation operation on a codeword that fails to be decoded in the Turbo product code on which iterative decoding is performed for the first iteration times.

2. The method according to claim 1, before performing iterative decoding on the received codeword for the set first iteration times, further comprising:
   acquiring a code pattern of a block code forming the Turbo product code, the code pattern comprises a maximum error-correctable code element number, wherein
   judging the decoding result of iterative decoding performed for the first iteration times according to the first decoding rule to obtain the decoding identifier representing the decoding result comprises:
   judging the decoding result of iterative decoding performed for the first iteration times according to the first decoding rule, the first decoding rule comprising at least one of the following: determining that the received codeword fails to be decoded when it is determined according to the code pattern that the received codeword is a shortened code and not all code elements at supplementary positions in the decoded received codeword are 0; determining that the received codeword fails to be decoded when it is determined according to the code pattern that the received codeword is an extended code and an original check bit of the received codeword is different from a check bit of the decoded received codeword; and determining that the received codeword fails to be decoded when it is determined that an error-corrected code element number of the decoded received codeword is equal to the maximum error-correctable code element number of the received codeword, a present iterative decoding times is equal to a set iterative decoding times threshold and the number of codewords that fail to be decoded in a previous iterative decoding process is less than a set threshold, or when it is determined that the error-corrected code element number of the decoded received codeword is equal to the maximum error-correctable code element number of the received codeword and the present iterative decoding times is unequal to the iterative decoding times threshold; and
   determining the decoding identifier of the decoding result corresponding to the received codeword according to a judgment result.

3. The method according to claim 2, before determining the decoding identifier of the decoding result corresponding to the received codeword according to the judgment result, further comprising:
   initializing a decoding identifier matrix, the decoding identifier matrix being equal to the Turbo product code in size, wherein
   determining the decoding identifier of the decoding result corresponding to the received codeword according to the judgment result comprises:
   updating a decoding identifier of each code element in the received codeword at a corresponding position in the decoding identifier matrix according to the judgment result.

4. The method according to claim 3, wherein the first decoding rule further comprises:
   if error correction is performed on a code element in the received codeword and a decoding identifier corresponding to the code element in the decoding identifier matrix represents that the code element has been decoded successfully, determining that the code element fails to be decoded.

5. The method according to claim 4, wherein performing error correction processing on the Turbo product code on which iterative decoding is performed for the first iteration times according to the decoding identifier comprises:
   acquiring the number of code elements that fail to be decoded according to the decoding identifier matrix; and
   executing the negation operation on the code elements that fail to be decoded in the Turbo product code on which iterative decoding is performed for the first iteration times according to a relationship between the number of code elements that fail to be decoded and a set third number threshold.

6. A decoder, comprising a processor and a memory configured to store a computer program capable of running in the processor, wherein the processor is configured to run the computer program to execute the decoding method for a Turbo product code as claimed in claim 4.

7. The method according to claim 3, wherein performing error correction processing on the Turbo product code on which iterative decoding is performed for the first iteration times according to the decoding identifier comprises:
acquiring the number of code elements that fail to be decoded according to the decoding identifier matrix; and
executing the negation operation on the code elements that fail to be decoded in the Turbo product code on which iterative decoding is performed for the first iteration times according to a relationship between the number of code elements that fail to be decoded and a set third number threshold.

8. A decoder, comprising a processor and a memory configured to store a computer program capable of running in the processor, wherein
the processor is configured to run the computer program to execute the decoding method for a Turbo product code as claimed in claim 7.

9. A decoder, comprising a processor and a memory configured to store a computer program capable of running in the processor, wherein
the processor is configured to run the computer program to execute the decoding method for a Turbo product code as claimed in claim 3.

10. A decoder, comprising a processor and a memory configured to store a computer program capable of running in the processor, wherein
the processor is configured to run the computer program to execute the decoding method for a Turbo product code as claimed in claim 2.

11. A non-transitory computer storage medium, in which a computer program is stored, wherein the computer program is executed by a processor to implement the steps of the decoding method for a Turbo product code as claimed in claim 2.

12. The method according to claim 1, after performing error correction processing on the Turbo product code on which iterative decoding is performed for the first iteration times according to the decoding identifier, further comprising:
performing iterative decoding on the Turbo product code subjected to error correction processing for a set second iteration times; and
judging a decoding result of iterative decoding performed for the second iteration times according to a second decoding judgment rule to acquire a target Turbo product code.

13. The method according to claim 12, wherein judging the decoding result of iterative decoding performed for the second iteration times according to the second decoding judgment rule comprises:
judging the decoding result of iterative decoding performed for the second iteration times according to the second decoding judgment rule, the second decoding rule comprises at least one of the following: determining that the received codeword fails to be decoded when it is determined according to the code pattern that the received codeword is a shortened code and not all the code elements at the supplementary positions in the decoded received codeword are 0; determining that the received codeword fails to be decoded when it is determined according to the code pattern that the received codeword is an extended code and the original check bit of the received codeword is different from the check bit of the decoded received codeword; and determining that the received codeword is decoded successfully when it is determined that the error-corrected code element number of the decoded received codeword is equal to the maximum error-correctable code element number of the received codeword.

14. A decoder, comprising a processor and a memory configured to store a computer program capable of running in the processor, wherein
the processor is configured to run the computer program to execute the decoding method for a Turbo product code as claimed in claim 13.

15. A decoder, comprising a processor and a memory configured to store a computer program capable of running in the processor, wherein
the processor is configured to run the computer program to execute the decoding method for a Turbo product code as claimed in claim 12.

16. A decoder, comprising a processor and a memory configured to store a computer program capable of running in the processor, wherein
the processor is configured to run the computer program to execute the decoding method for a Turbo product code as claimed in claim 1.

17. A non-transitory computer storage medium, in which a computer program is stored, wherein the computer program is executed by a processor to implement the steps of the decoding method for a Turbo product code as claimed in claim 1.

18. A decoding device for a Turbo product code, comprising:
an acquisition module, configured to acquire a received codeword of a Turbo product code;
a preliminary iterative decoding module, configured to perform iterative decoding on the received codeword for a set first iteration times and judge a decoding result of the iterative decoding performed for the first iteration times according to a first decoding rule to obtain a decoding identifier representing the decoding result; and
a deadlock correction module, configured to perform error correction processing on the Turbo product code on which iterative decoding is performed for the first iteration times according to the decoding identifier;
wherein the deadlock correction module is further configured to:
acquire the number of rows that fail to be decoded during last row iterative decoding corresponding to the first iteration times and the number of columns that fail to be decoded during last column iterative decoding according to the decoding identifier; and
when it is determined that the number of the rows is equal to or greater than a set first number threshold and the number of the columns is equal to or greater than a set second number threshold, execute a negation operation on a codeword that fails to be decoded in the Turbo product code on which iterative decoding is performed for the first iteration times.

* * * * *